US010153140B2

(12) United States Patent
Chang et al.

(10) Patent No.: US 10,153,140 B2
(45) Date of Patent: Dec. 11, 2018

(54) METHOD OF INSTALLING ELASTOMER RING IN SEMICONDUCTOR PROCESSING EQUIPMENT AND GUIDING SHEET AND JIG USED IN INSTALLING ELASTOMER RING

(71) Applicant: MFC SEALING TECHNOLOGY CO., LTD., New Taipei (TW)

(72) Inventors: Yo-Yu Chang, New Taipei (TW); Chun-Yao Huang, New Taipei (TW)

(73) Assignee: MFC SEALING TECHNOLOGY CO., LTD., New Taipei (TW)

( * ) Notice: Subject to any disclaimer, the term of this patent is extended or adjusted under 35 U.S.C. 154(b) by 201 days.

(21) Appl. No.: 14/957,871

(22) Filed: Dec. 3, 2015

(65) Prior Publication Data

US 2016/0163518 A1    Jun. 9, 2016

(30) Foreign Application Priority Data

Dec. 9, 2014   (TW) .............................. 103142914 A
Aug. 19, 2015  (TW) .............................. 104126947 A

(51) Int. Cl.
*H01J 37/32*   (2006.01)
*B25B 27/00*   (2006.01)
*H01L 21/67*   (2006.01)

(52) U.S. Cl.
CPC .... *H01J 37/32807* (2013.01); *B25B 27/0028* (2013.01); *B25B 27/0092* (2013.01); *H01L 21/67126* (2013.01); *H01J 2237/334* (2013.01)

(58) Field of Classification Search
CPC .......... H01J 37/32807; H01J 2237/334; H01L 21/67126; B25B 27/0028; B25B 27/009
See application file for complete search history.

(56) References Cited

U.S. PATENT DOCUMENTS

| 6,526,640 B1 | 3/2003 | Li et al. | |
| 2002/0063396 A1* | 5/2002 | Doyle | B25B 27/0028 277/609 |
| 2007/0176026 A1 | 8/2007 | Frisch et al. | |
| 2013/0264778 A1 | 10/2013 | Doyle | |

FOREIGN PATENT DOCUMENTS

| CN | 101840849 A | 9/2010 |
| JP | 2010-076037 A | 4/2010 |
| TW | I503920 B | 10/2010 |

* cited by examiner

*Primary Examiner* — John C Hong
(74) *Attorney, Agent, or Firm* — patenttm.us

(57) ABSTRACT

Provided are a method, a guiding sheet, a partial filling jig, and a full filling jig for installing an elastomer ring in the semiconductor processing equipment. The guiding sheet, the partial filling jig, and the full filling jig dispose the elastomer ring in the groove of the semiconductor processing equipment smoothly and evenly. Furthermore, the surface of the elastomer ring may be divided to multiple arcs portions. Each one of the arc portions may be pressed by the partial filling jig or the full filling jig in a particular sequence. When the groove is filled by the elastomer ring accurately and completely, the elastomer ring may block the fluid and the etching gas effectively. The elastomer ring may help the semiconductor processing equipment to work continuously and maintain qualities of the etching wafers.

22 Claims, 21 Drawing Sheets

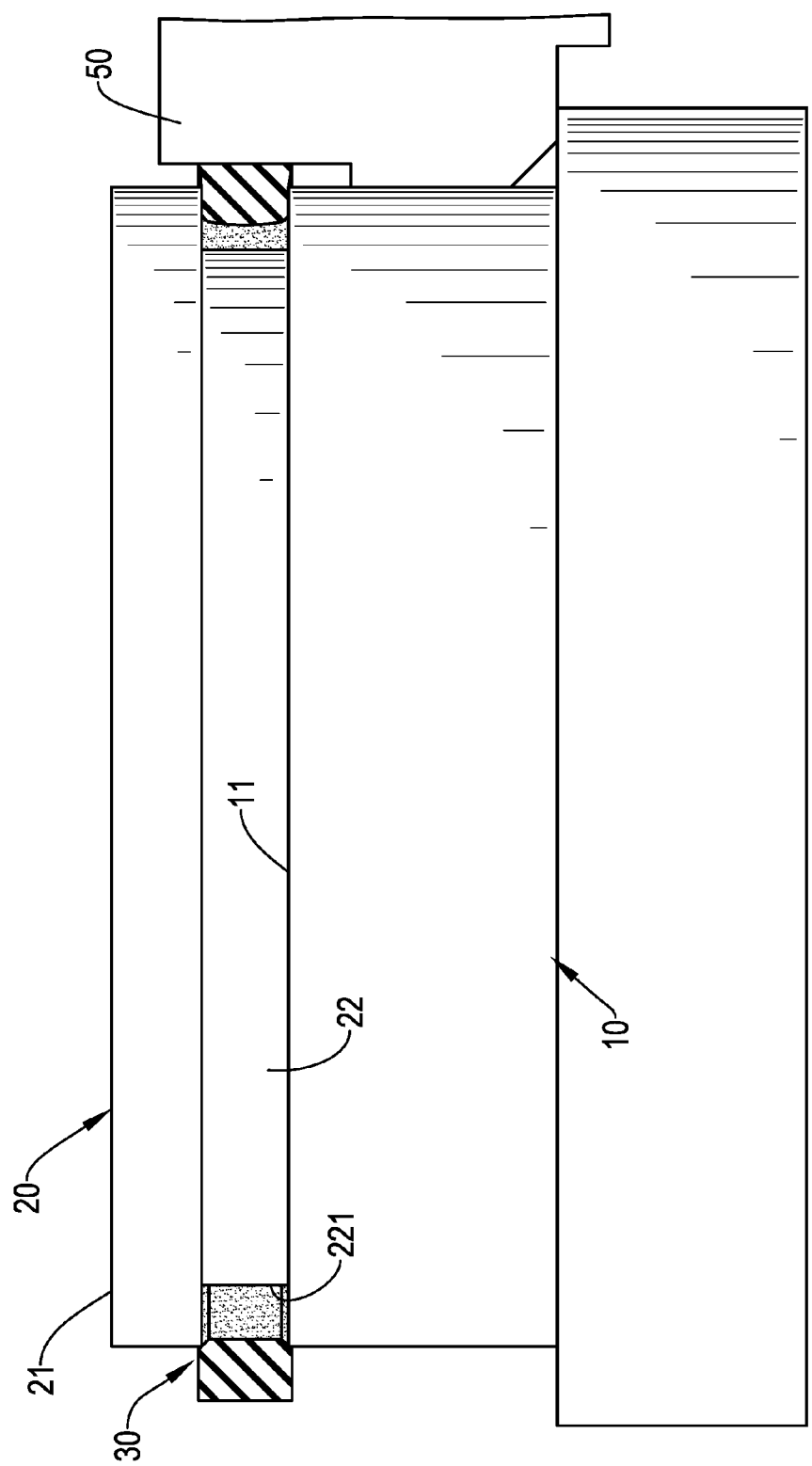

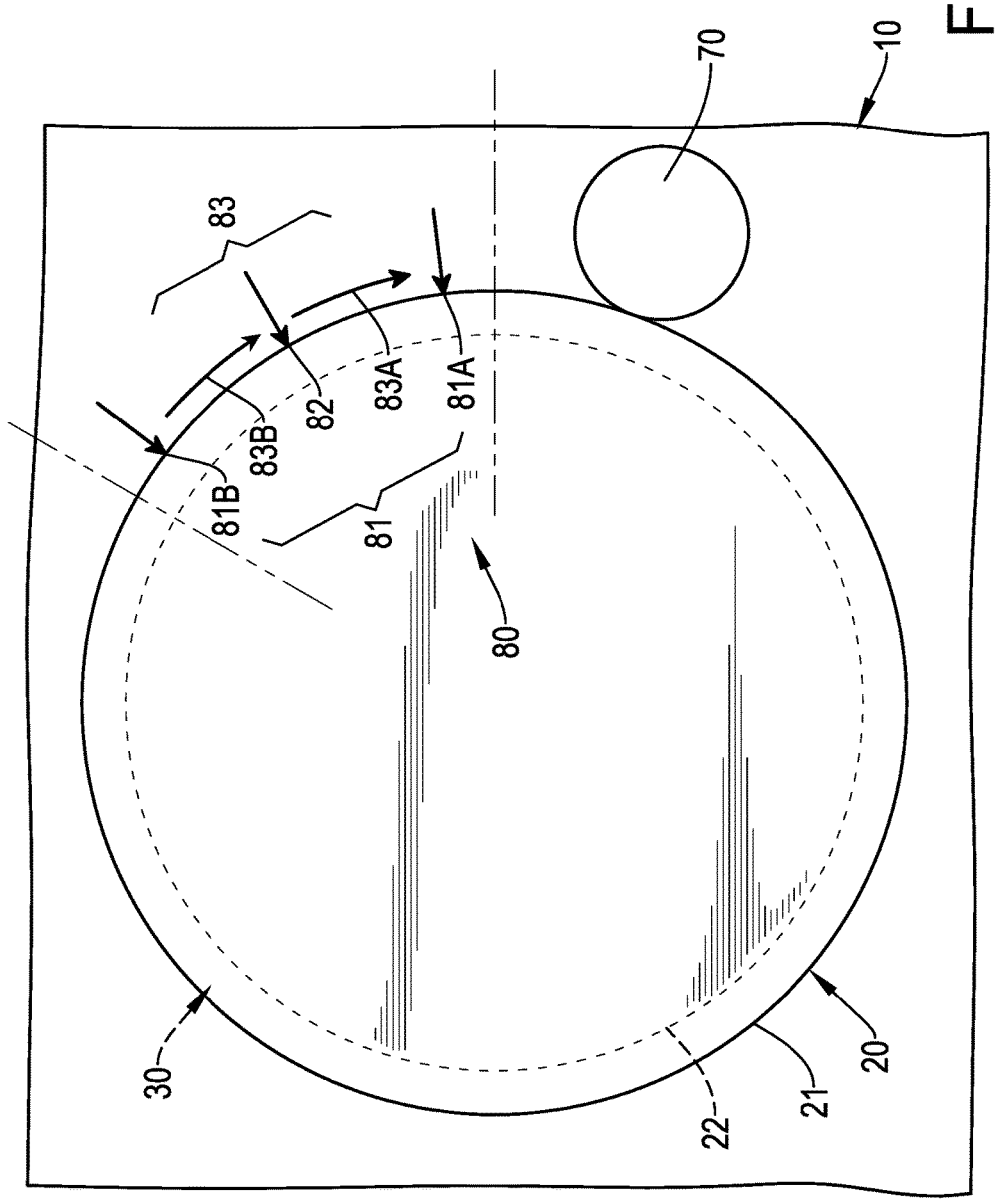

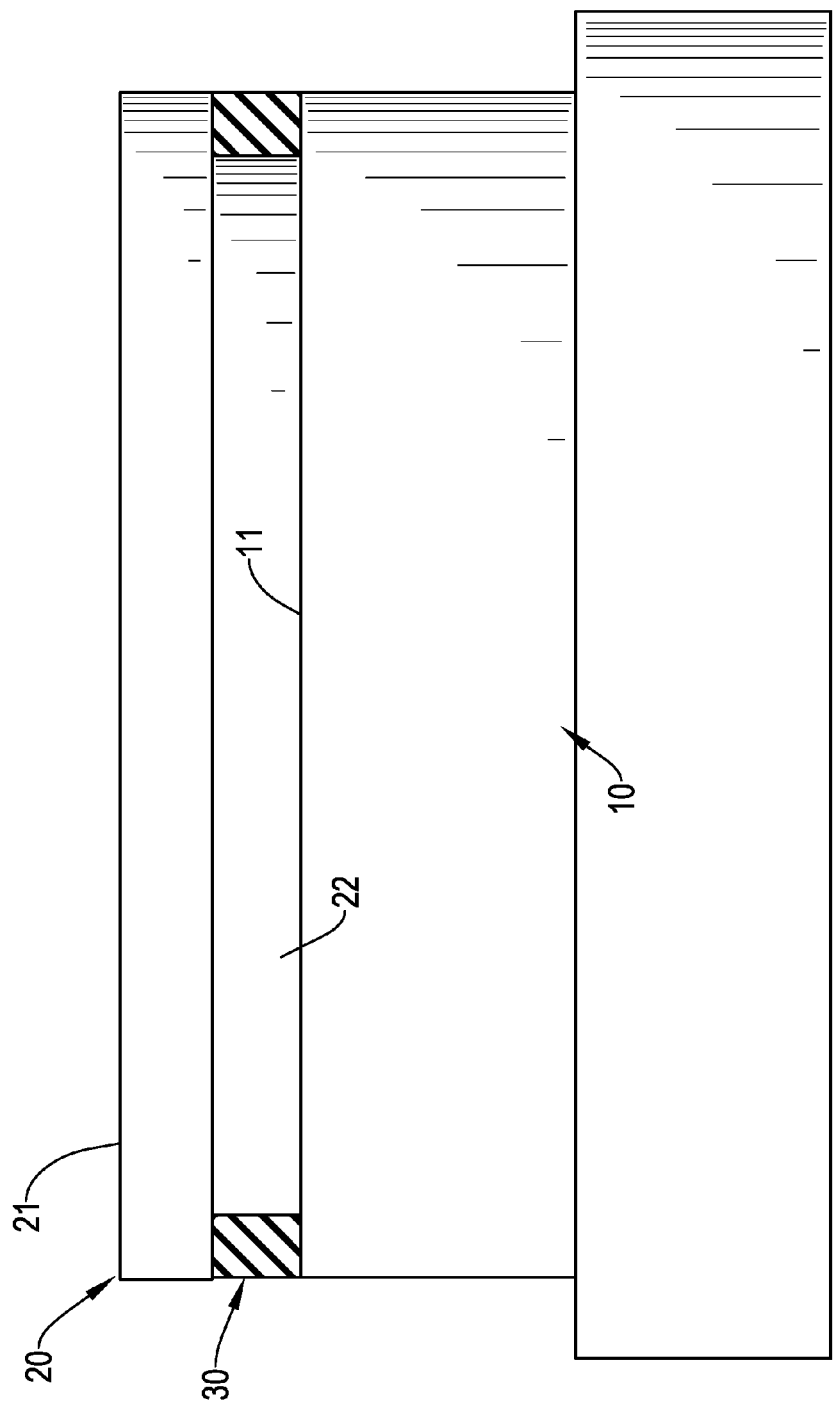

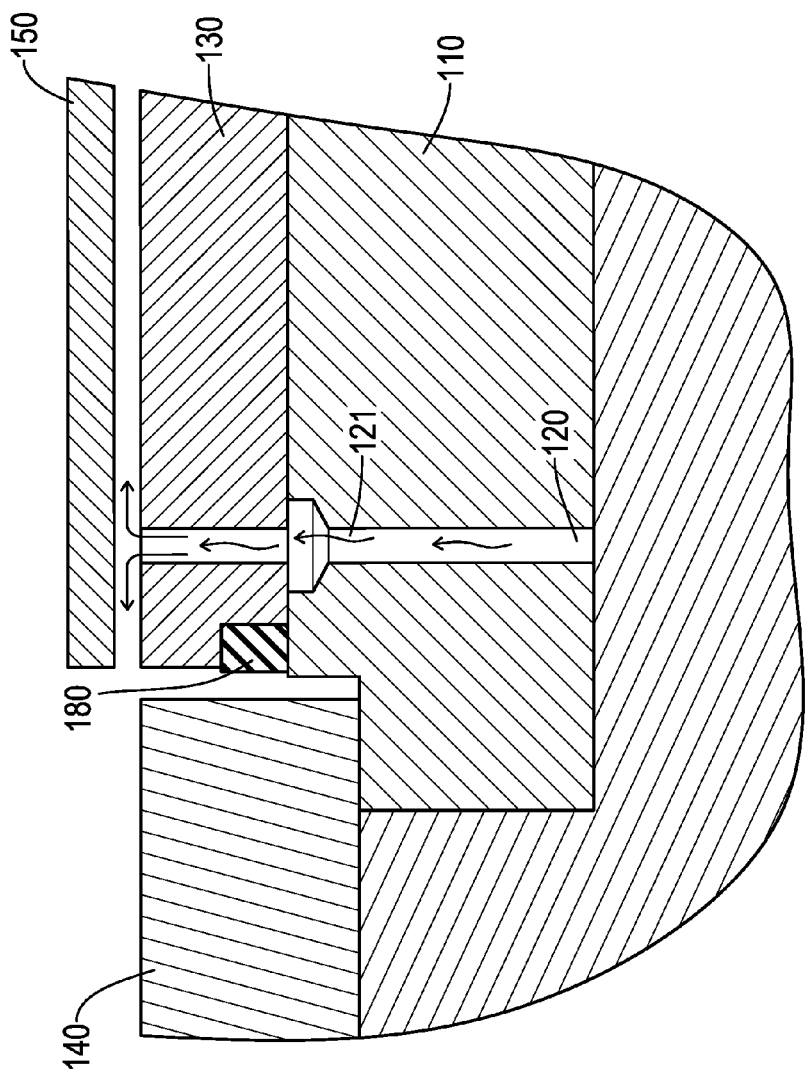

METHOD OF INSTALLING ELASTOMER RING IN SEMICONDUCTOR PROCESSING EQUIPMENT AND GUIDING SHEET AND JIG USED IN INSTALLING ELASTOMER RING

BACKGROUND OF THE INVENTION

1. Field of the Invention

The present invention relates to a method of installing an elastomer ring in a semiconductor processing equipment, and more particularly to a method of installing the elastomer ring into a groove of the semiconductor processing equipment with accuracy and conformity. In addition, the present invention also provides a guiding sheet and a jig to install the elastomer ring in the semiconductor processing equipment.

2. Description of the Related Art

Conventional semiconductor processing equipment is shown in FIGS. 18 and 19. The conventional semiconductor processing equipment comprises a chamber 100, and a susceptor 110, a fluid supplying unit 120, a supporting element 130, and an extending cover 140 are mounted in the chamber 100. The wafer 150 is disposed on the supporting element 130, and the wafer 150 is etched by etching gas 170. The supporting element 130 is disposed on the susceptor 110. The fluid supplying unit 120 is disposed in the susceptor 110 and the supporting element 130 to provide fluid 121. In etching process, the fluid 121 flows from the fluid supplying unit 120 toward the wafer 150. The wafer 150 floats on the supporting element 130 and the wafer 150 is etched by the etching gas 170. Slits are formed between the susceptor 110 and the supporting element 130 by the etching gas 170. The fluid 121 may flow into the groove 160 between the susceptor 110 and the supporting element 130. A passage is formed between the susceptor 110 and the extending cover 140. The fluid 121 may also flow into the passage through the slits and damage the conventional semiconductor processing equipment. In addition, the fluid 121 may induce pollution of the environment.

In order to resolve said problems, an elastomer ring 180 is utilized to seal the groove 160 between the susceptor 110 and the supporting element 130 as shown in FIG. 20. The slits between the susceptor 110 and the supporting element 130 are also blocked by the elastomer ring 180. The fluid 121 does not flow into the groove 160 and the passage, and the etching gas 170 does not erode the groove 160.

There is another problem that the size of the groove 160 between the susceptor 110 and the supporting element 130 is very small. It is not easy to install the elastomer ring 180 into the groove 160. If the elastomer ring 180 protrudes to the passage between the susceptor 110 and the extending cover 140, the conventional semiconductor processing equipment may abruptly stop working.

Furthermore, the elastomer ring 180 is eroded and becomes thinner by the fluid 121 and the etching gas 170 gradually. If the elastomer ring 180 cannot be disposed in the groove 160 evenly, users may hardly estimate the lifetime of the elastomer ring 180. If the elastomer ring is unable to block the fluid 121 and the etching gas 170 suddenly, the erosion of the groove 160 and the pollution will be induced. Many problems still exist in installing the elastomer ring 180 in a semiconductor processing equipment.

SUMMARY OF THE INVENTION

An objective of the present invention is to provide methods and tools to assist with disposing the elastomer ring in the groove smoothly and evenly. The methods and tools of the present invention may ensure the elastomer ring does not protrude to the passage to affect the operation of the semiconductor processing equipment. Furthermore, the elastomer ring will protect the groove before the lifetime of the elastomer ring expires.

To achieve the foregoing objective, the present invention provides methods for installing an elastomer ring in a semiconductor processing equipment which comprises a susceptor body and a supporting element. The susceptor body further comprises a top surface, and the supporting element is disposed on the top surface of the susceptor body. The supporting element comprises a top portion and a connecting portion. A groove is formed among the top surface, the top portion, and the connecting portion. The method of installing the elastomer ring in said semiconductor processing equipment comprises the following steps:

disposing preliminarily: disposing the elastomer ring to a side surface of the susceptor body and close to the top surface of the susceptor body;

positioning: placing the elastomer ring into a notch formed on a guiding sheet; moving the elastomer ring toward a periphery of the groove with the guiding sheet, and then aligning the elastomer ring to the groove;

filling partially: pressing the elastomer ring by a partial filling jig; disposing the elastomer ring into the groove and partially filling the groove by the elastomer ring; and filling fully: pressing the elastomer ring by a full filling jig until the groove is completely filled by the elastomer ring.

The advantage of the present invention is utilizing the guiding sheet and the partial filling jig to move the elastomer ring into the groove step by step. The elastomer ring is disposed in the groove evenly through the manual operation to ensure that the semiconductor processing equipment works well. The lifetime of the elastomer ring can be accurately predicted and the fluid leak from the slits between the susceptor body and the connecting portion is effectively prevented.

Particularly, multiple points of the elastomer ring are pressed in a particular sequence by the partial filling jig along an outer surface of the elastomer ring. The method further comprises: defining the outer surface of the elastomer ring equally into multiple arcs. Then the partial filling jig presses each one of the multiple arcs gradually. Each one of the multiple arcs includes two endpoints, one midpoint, and two relay points respectively. The two endpoints are the first endpoint and the second endpoint, and the two relay points are the first relay point and the second relay point. The midpoint is in the middle between the first endpoint and the second endpoint. The first relay point is in the middle between the second endpoint and the midpoint, and the second relay point is in the middle between the first endpoint and the midpoint. The particular sequence is that the partial filling jig presses the first endpoint before pressing the second endpoint, and then the partial filling jig presses the midpoint. Finally, the partial filling jig presses the second relay point after pressing the first relay point. The step of filling partially is finished when the multiple arcs are all filled through the particular sequence. The advantage of the present invention is that the outer surface of the elastomer ring may be pressed in the particular sequence by the partial filling jig. Then the elastomer ring moves into the groove smoothly and evenly. In addition, the elastomer ring does not rotate in the groove. The elastomer ring may not protrude from the groove to impede the working of the semiconductor processing equipment.

More particularly, multiple points on the elastomer ring and multiple segments of the elastomer ring are pressed and rolled in a particular sequence by the full filling jig along an outer surface of the elastomer ring. The method further comprises: defining the outer surface of the elastomer ring equally into multiple arcs first. The full filling jig presses each arc of the multiple arcs gradually. Each arc of the multiple arcs includes two terminal points, one intermediate point, and two rolling segments respectively. The two terminal points are the first terminal point and the second terminal point, and the two rolling segments are the first rolling segment and the second rolling segment. The intermediate point is in the middle between the first terminal point and the second terminal point. The first rolling segment is between the first terminal point and the intermediate point, and the second rolling segment is between the second terminal point and the intermediate point. The particular sequence is that the full filling jig presses the first terminal point before pressing the intermediate point, and then the full filling jig rolls the first rolling segment from the intermediate point to the first terminal point. Finally, the full filling jig rolls the second rolling segment from the second terminal point to the intermediate point after pressing the second terminal point. The step of filling fully is finished when the multiple arcs are all pressed and rolled through the particular sequence. The advantage of the present invention is that the outer surface of the elastomer ring may be pressed in the particular sequence by the full filling jig. Then the elastomer ring further moves into the groove after pressing by the full filling jig regularly. The groove is filled by the elastomer ring completely. The elastomer ring has a specific lifetime after the elastomer ring is installed into the groove with accuracy and conformity. Users may timely replace the elastomer ring before the leaking and the erosion occur.

Perfectly, the cross-section of the elastomer ring is a rectangle. The elastomer ring comprises a radial width and a height. The ratio of the radial width to the height is larger than 0.5. A side of the elastomer ring toward the groove comprises two edges. The two edges are chamfered edges respectively. The advantage of the present invention is that the elastomer ring with the specific ratio of the radial width and the height may move into the groove easily through the designs of the two chamfered edges.

The present invention further provides a guiding sheet for installing the elastomer ring in a semiconductor processing equipment. The guiding sheet comprises: a body portion and a bending portion. The body portion connects to the bending portion. An angle is formed between the body portion and the bending portion. The notch is recessed on a side of the bending portion, and the side of the bending portion is opposite to the body portion. The notch is corresponding to the elastomer ring in shape. The advantage of the present invention is that the elastomer ring may be covered and accommodated by the notch of the guiding sheet. The elastomer ring may be moved to align to the groove with the guiding sheet. The guiding sheet guides the elastomer ring to align to the groove before pressing by the partial filling jig. Then the elastomer ring may be pressed into the groove smoothly and evenly.

The present invention further provides a partial filling jig for installing the elastomer ring in a semiconductor processing equipment. The partial filling jig comprises two semicircular structures and two packing assemblies. The inner sides of the two semicircular structures are opposite each other, and the inner sides of the two semicircular structures are corresponding to the elastomer ring in shape. Each one of the two semicircular structures comprises two ends, and two protrusions are formed on the two ends of each one of the two semicircular structures respectively. The two protrusions protrude toward the outer side of each one of the two semicircular structures respectively. The two packing assemblies are mounted on the two protrusions of each semicircular structure respectively. The advantage of the present invention is that the two semicircular structures may be connected by the packing assembly on the two ends of each semicircular structure. A circular space is formed by connecting the two semicircular structures. The area of the circular space may be regulated by the packing assembly, and the elastomer ring may be restricted in the circular space. If the area of the circular space becomes smaller through the packing assembly, the elastomer ring will be pressed by the two semicircular structures more strongly. Then the elastomer ring may be moved into the groove evenly.

Particularly, the two protrusions of each one of the two semicircular structures comprise a fixing hole respectively. The packing assembly is a screw and a nut. The screw is corresponding to the nut. The screw and the nut are mounted on two opposite sides of each one of the two protrusions. The screw penetrates through the fixing hole, and the nut is screwed with the screw. The advantage of the present invention is that the packing assembly comprises a screw and a nut. The area of the circular space may be regulated by the screwing state, and the elastomer ring may be pressed strongly or partially according to the screwing state.

The present invention further provides a full filling jig for installing the elastomer ring in a semiconductor processing equipment. The full filling jig comprises a body with a rolling surface around the body. The rolling surface is in an arc shape. The advantage of the present invention is that the elastomer ring may be pressed and rolled by rolling the full filling jig on the outer surface of the elastomer ring back and forth. Then the elastomer ring is disposed in the groove after rolling the full filling jig on the outer surface of the elastomer ring.

Particularly, the body of the full filling jig comprises at least two cavities. The at least two cavities are recessed on the rolling surface. Multiple limited rolling surfaces are formed from dividing the rolling surface by the at least two cavities. The advantage of the present invention is that the full filling jig with the limited rolling surfaces may prevent the operator rolling continuously only on the outer surface of the elastomer ring. The problems caused by indolence of the operator may be resolved through using the full filling jig.

More particularly, a through hole is formed at a geometric center of the body. The advantage of the present invention is that the weight of the full filling jig may be reduced by the through hole. Furthermore, the through hole at the geometric center of the body also provides convenience for the operator to hold the full filling jig stably by inserting the finger into the through hole.

The present invention further provides another method of installing an elastomer ring in a semiconductor processing equipment comprising steps of:

disposing preliminarily: disposing the elastomer ring to a side surface of the susceptor body and close to the top surface;

covering and filling partially: covering the groove with the elastomer ring, and inserting a sheet into a gap between the groove and the elastomer ring to dispose the elastomer ring into the groove evenly; filling the groove partially by the elastomer ring; and filling fully: pressing the elastomer ring by a full filling jig until the groove is completely filled by the elastomer ring.

The advantage of the method is that the positioning step is omitted. The sheet guides the elastomer ring to move into the groove smoothly. The elastomer ring is disposed in the groove evenly through the manual operation, and the elastomer ring does not rotate in the groove. The lifetime of the elastomer ring can be expected and the fluid leaking from the slits between the susceptor body and the connecting portion may be effectively prevented.

Particularly, multiple points on the elastomer ring and multiple segments of the elastomer ring are pressed and rolled in a particular sequence by the full filling jig along an outer surface of the elastomer ring. The method further comprises: defining the outer surface of the elastomer ring equally into multiple arcs first. The full filling jig presses each one of the multiple equal arcs gradually. Each one of the multiple equal arcs includes two terminal points, one intermediate point, and two rolling segments respectively. The two terminal points are the first terminal point and the second terminal point, and the two rolling segments are the first rolling segment and the second rolling segment. The intermediate point is in the middle between the first terminal point and the second terminal point. The first rolling segment is between the first terminal point and the intermediate point, and the second rolling segment is between the second terminal point and the intermediate point. The particular sequence is that the full filling jig presses the first terminal point before pressing the intermediate point, and then the full filling jig rolls the first rolling segment from the intermediate point to the first terminal point. Finally, the full filling jig rolls the second rolling segment from the second terminal point to the intermediate point after pressing the second terminal point. The step of filling fully is finished when the multiple arcs are all pressed and rolled through the particular sequence. The advantage of the present invention is that the outer surface of the elastomer ring is divided into many arc portions. Each arc portion may be pressed in the particular sequence by the full filling jig. Then the elastomer ring further moves into the groove regularly. The groove is filled by the elastomer ring completely. The elastomer ring has a specific lifetime after the elastomer ring is installed into the groove with accuracy and conformity. Users may timely replace the elastomer ring before the leaking and the erosion happen.

Perfectly, the cross-section of the elastomer ring is a rectangle. The elastomer ring comprises a radial width and a height. The ratio of the radial width to the height is less than 0.5. A side of the elastomer ring toward the groove comprises two edges. The two edges are chamfered edges respectively. The advantage of the present invention is that the elastomer ring with the specific ratio of the radial width and the height may be disposed in the groove easily by the two chamfered edges.

The present invention further provides a sheet for installing the elastomer ring in a semiconductor processing equipment. The sheet comprises two opposite surfaces, and one of the two opposite surfaces is corresponding to the inner side of the elastomer ring. The advantage of the present invention is that the inner side of the elastomer ring may be made smooth by the sheet. The elastomer ring may not rotate before moving into the groove, and the elastomer ring is disposed in the groove easily.

BRIEF DESCRIPTION OF THE DRAWINGS

FIG. 3A is a schematic view of the elastomer ring pressed by the partial filling jig in accordance with the present invention;

FIG. 4 is a top view of the elastomer ring pressed by the full filling jig in accordance with the present invention;

FIG. 5 is a schematic view of the elastomer ring pressed by the full filling jig in accordance with the present invention;

FIG. 20 is a schematic view of the elastomer ring disposed in the conventional semiconductor processing equipment.

DETAILED DESCRIPTION OF THE INVENTION

Figure 1:
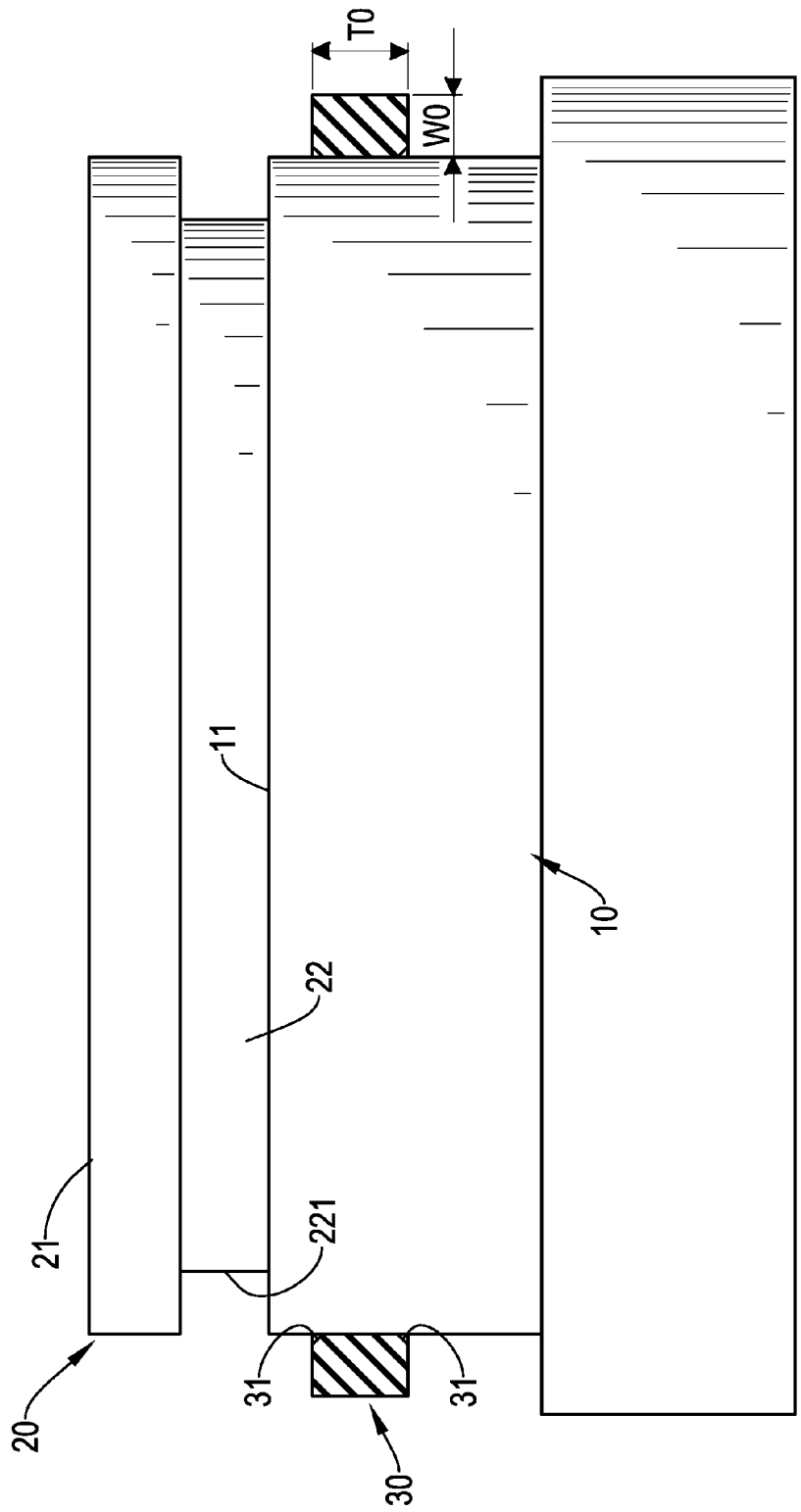
FIG. 1 is a schematic view of the elastomer ring disposed on a side surface of the susceptor body in accordance with the present invention.

With reference to FIG. 1, the semiconductor processing equipment comprises a susceptor body 10 and a supporting element 20. The susceptor body 10 has a top surface 11, and the supporting element 20 further has a top portion 21 and a connecting portion 22. The supporting element 20 is disposed on the top surface 11 of the susceptor body 10, and the connecting portion 22 of the supporting element 20 connects with the susceptor body 10 and the supporting element 20. A groove 221 is formed on the outer surface of the connecting portion 22, and the groove 221 is among the top surface 11, the top portion 21, and the connecting portion 22.

The first step of a method for installing an elastomer ring 30 in the semiconductor processing equipment in accordance with the present invention is preliminary disposing the elastomer ring. The elastomer ring 30 is mounted to the side surface of the susceptor body 10 and is close to the top surface 11. The elastomer ring 30 is stretched through disposing around and on the side surface of the susceptor body 10.

The elastomer ring 30 is made of rubber. The cross-section of the elastomer ring 30 is a rectangle, and the elastomer ring 30 includes a radial width W0 and a height T0. The ratio of the radial width W0 to the height T0 is larger than 0.5. It means the height T0 is less than double of the radial width W0.

Furthermore, a side toward the groove 221 of the elastomer ring 30 has two edges, and the two edges are chamfered edges 31 respectively. The chamfered edges 31 help the elastomer ring 30 to be disposed in the groove 221 easily.

Figure 2:
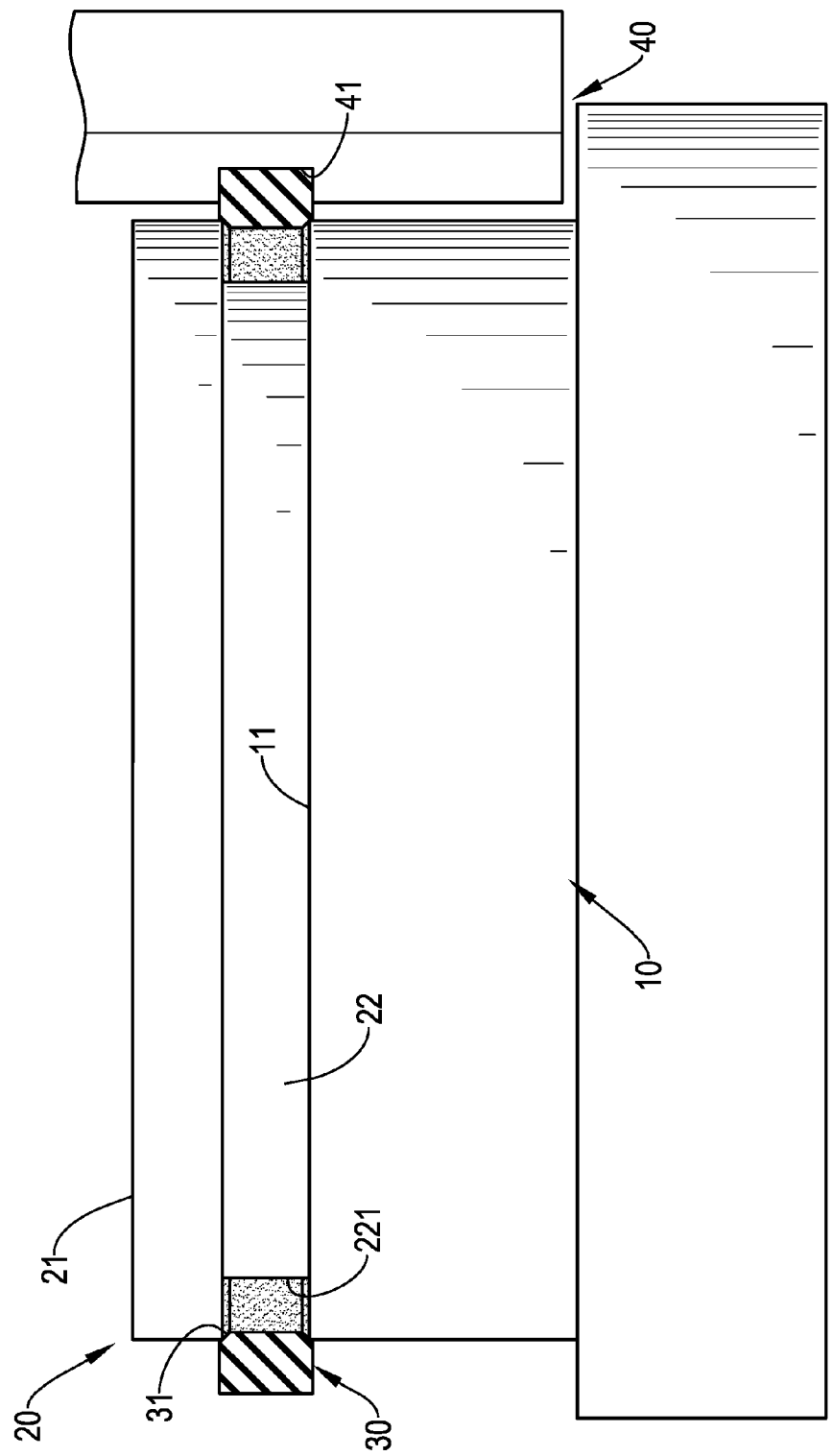
FIG. 2 is a schematic view of the elastomer ring moved by a guiding sheet to align with the groove in accordance with the present invention.

With reference to FIG. 2, a guiding sheet 40 has a notch 41. The notch 41 is corresponding to the elastomer ring 30 in shape. The second step of the method for installing the elastomer ring 30 in a semiconductor processing equipment in accordance with the present invention is the positioning step. The notch 41 of the guiding sheet 40 covers the outer surface of the elastomer ring 30. Then the elastomer ring 30 moves toward a periphery of the groove 221 with the guiding sheet 40, and then the elastomer ring 30 is aligned to the groove 221 accurately.

With reference to FIG. 3A, the guiding sheet 40 is removed after the positioning step. The third step of the method for installing the elastomer ring 30 in a semiconductor processing equipment in accordance with the present invention is pressing the elastomer ring 30 into the groove 221 partially. The elastomer ring 30 is pressed by a partial filling jig 50. The partial filling jig 50 contacts the outer surface of the elastomer ring 30 to move the elastomer ring 30 slowly into the groove 221. The elastomer ring 30 is extruded by the groove 221, and the groove 221 is partially filled by the elastomer ring 30 after pushing by the partial filling jig 50.

Figure 3B:
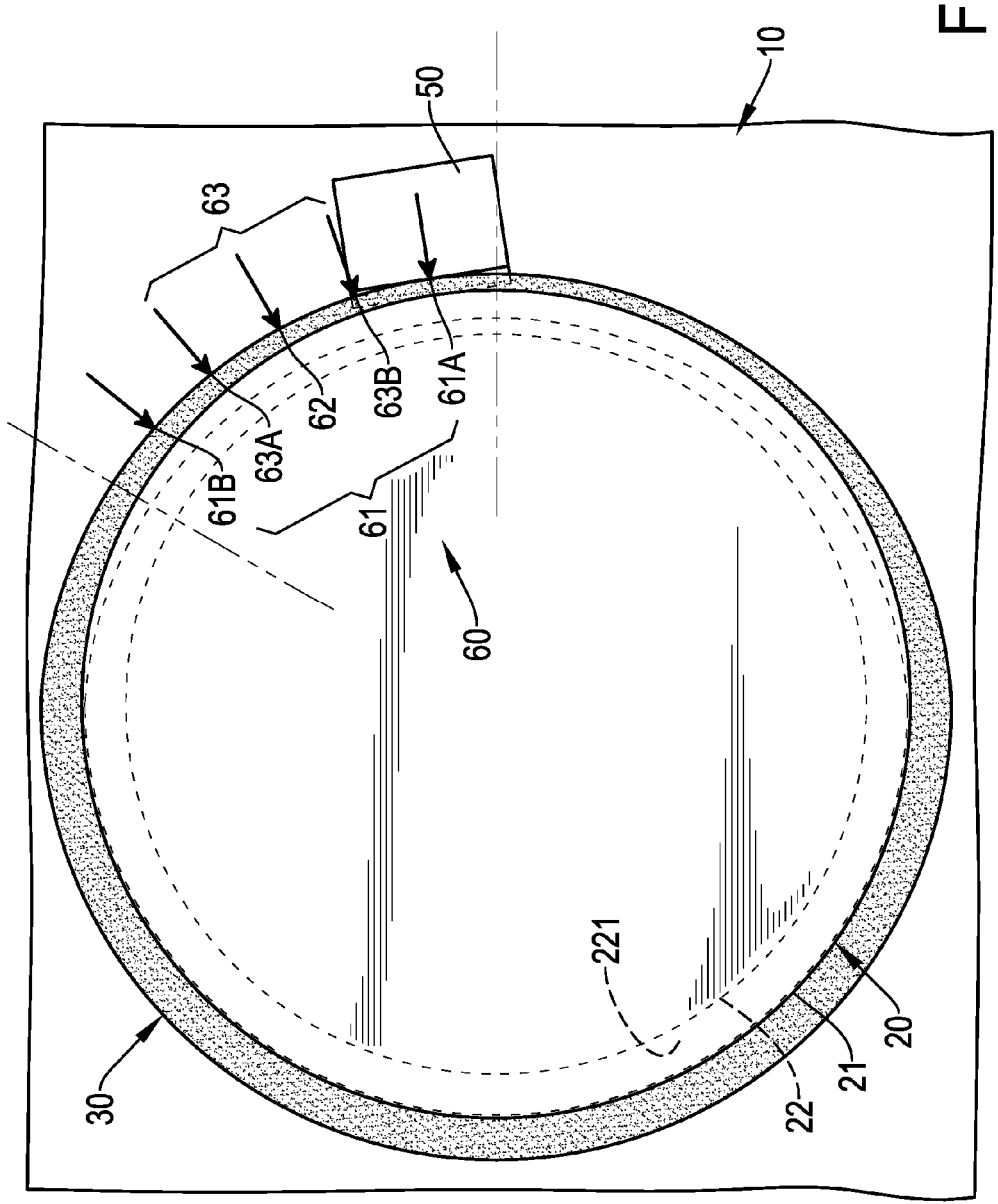
FIG. 3B is a top view of the elastomer ring pressed by the partial filling jig in accordance with the present invention.

With reference to FIG. 3B, the outer surface of the elastomer ring 30 is pressed in a particular sequence by the partial filling jig 50. Multiple arcs 60 of the outer surface of the elastomer ring 30 are defined by pre-marking the supporting element 20. The length of each one of the multiple arcs 60 can be regulated by the diameter of the elastomer ring 30. Each one of the multiple arcs 60 has two endpoints 61, one midpoint 62, and two relay points 63. The two endpoints 61 are a first endpoint 61A and a second endpoint 61B. The two relay points 63 are a first relay point 63A and a second relay point 63B. The midpoint 62 is in the middle between the first endpoint 61A and the second endpoint 61B. The first relay point 63A is in the middle between the second endpoint 61B and the midpoint 62, and the second relay point 63B is in the middle between the first endpoint 61A and the midpoint 62. The particular sequence comprises: the partial filling jig 50 presses each one of the multiple arcs 60 from the first endpoint 61A, the second endpoint 61B, the midpoint 62, the first relay point 63A, and the second relay point 63B. The step of filling the elastomer ring 30 partial is finished when the multiple arcs 60 of the elastomer ring 30 are all pressed by the partial filling jig 50 according to the particular sequence.

With reference to FIG. 4, the partial filling jig 50 is removed after the partial filling. The fourth step of the method for installing the elastomer ring 30 in a semiconductor processing equipment in accordance with the present invention is pressing the elastomer ring 30 entirely into the groove 221. The elastomer ring 30 is pressed and rolled by a full filling jig 70. The full filling jig 70 contacts the outer surface of the elastomer ring 30 and moves the elastomer ring 30 completely into the groove 221. The groove 221 is completely filled by the elastomer ring 30 after pushing and rolling by the full filling jig 70.

The outer surface of the elastomer ring 30 is pressed and rolled in a particular sequence by the full filling jig 70. Multiple arcs 80 of the outer surface of the elastomer ring 30 are also defined by pre-marking the supporting element 20. Each one of the multiple arcs 80 has two terminal points 81, one intermediate point 82, and two rolling segments 83. The two terminal points 81 are a first terminal point 81A and a second terminal point 81B, and the two rolling segments 83 are a first rolling segment 83A and a second rolling segment 83B. The intermediate point 82 is in the middle between the first terminal point 81A and the second terminal point 81B. The first rolling segment 83A is between the first terminal point 81A and the intermediate point 82, and the second rolling segment 83B is between the second terminal point 81B and the intermediate point 82. The particular sequence comprises: the full filling jig 70 presses the first terminal point 81A before pressing the intermediate point 82, and then the full filling jig 70 rolls the first rolling segment 83A from the intermediate point 82 to the first terminal point 81A. Then the full filling jig 70 rolls the second rolling segment 83B from the second terminal point 81B to the intermediate point 82 after pressing the second terminal point 81B. The step of filling fully is finished when the multiple arcs 80 of the elastomer ring 30 are all pressed and rolled by the full filling jig 70 in the particular sequence.

With reference to FIG. 5, the elastomer ring 30 is totally disposed in the groove 221 after the steps of partial filling and full filling.

Figure 6:
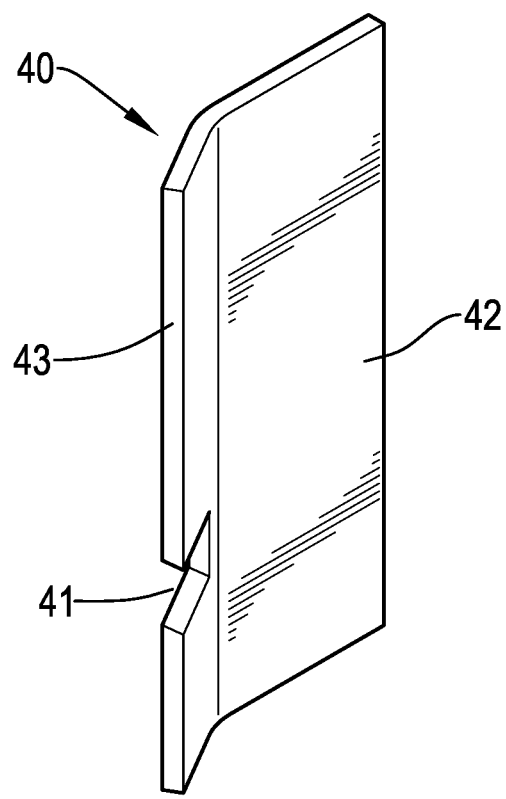
FIG. 6 is a schematic view of the guiding sheet in accordance with the present invention.

With reference to FIGS. 2 and 6, the guiding sheet 40 comprises: a body portion 42 and a bending portion 43. The body portion 42 connects to the bending portion 43. An angle is formed between the body portion 42 and the bending portion 43. The notch 41 is recessed on a side of the bending portion 43 opposite to the body portion 42, and the notch 41 is corresponding to the elastomer ring 30 in shape. The guiding sheet 40 guides the elastomer ring 30 to move to the position and align to the groove 221 accurately. The guiding sheet 40 is made of the engineering plastic such as polytetrafluoroethylene (PTFE). The friction coefficient of the engineering plastic is less than normal rubbers.

Figure 7A:
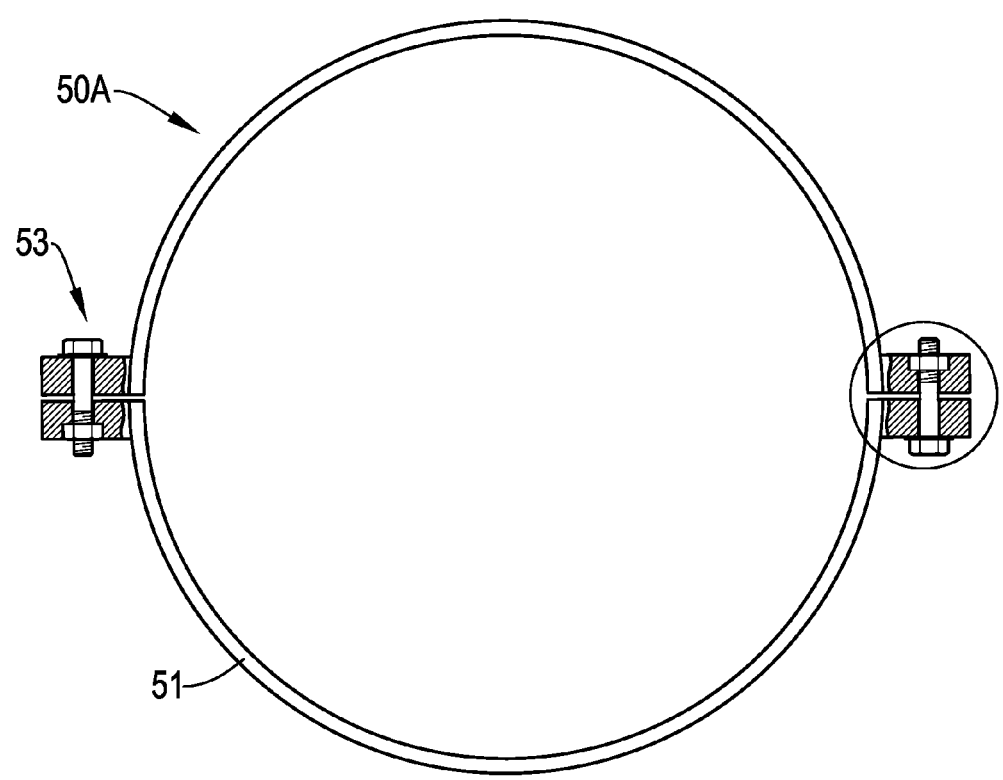
FIG. 7A is a top view of the partial filling jig in accordance with the present invention.
Figure 7B:
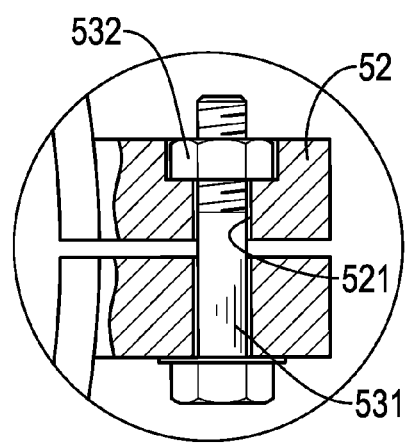
FIG. 7B is a partial enlarged view of FIG. 7A.
Figure 8:
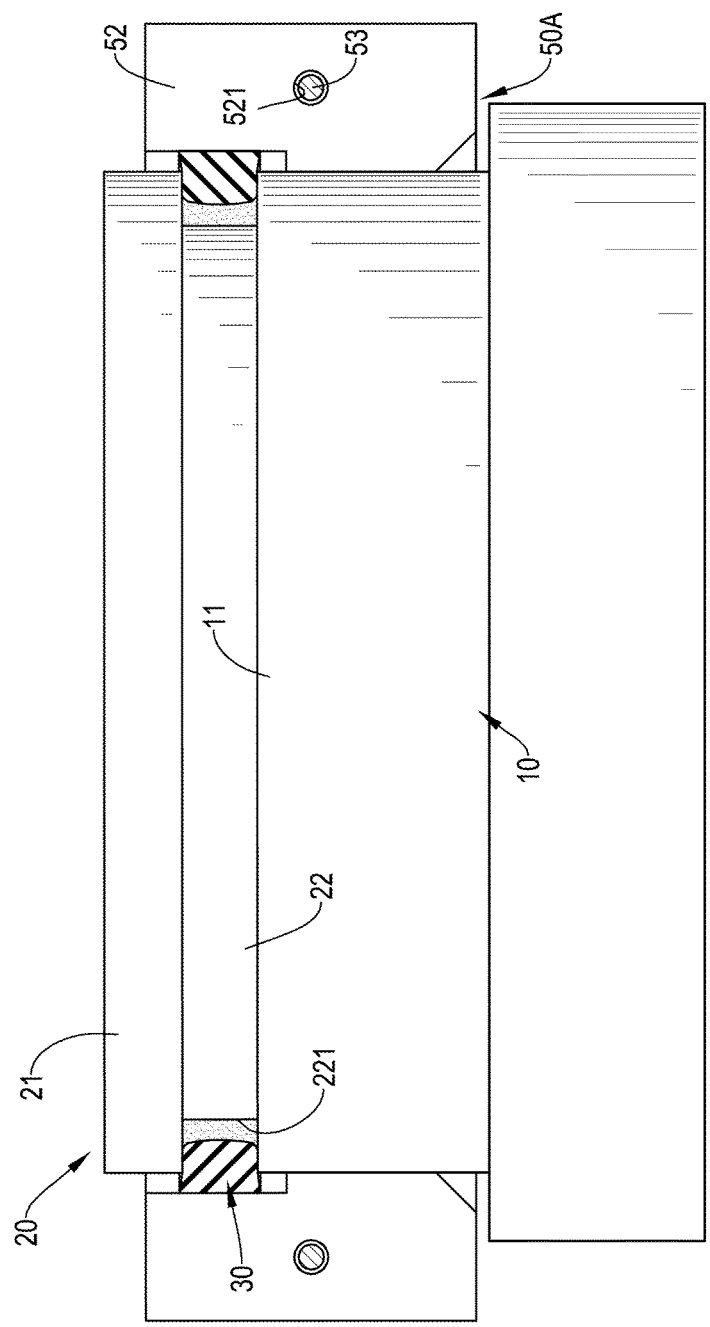
FIG. 8 is a schematic view showing the partial filling jig presses on the elastomer ring in accordance with the present invention.

With reference to FIGS. 7A, 7B and 8, another embodiment of the partial filling jig 50A is two semicircular structures 51. The inner sides of the two semicircular structures 51 are opposite each other and are corresponding to the elastomer ring 30 in shape. Each one of the two semicircular structures 51 comprises two ends, and two protrusions 52 are formed on the two ends of each one of the two semicircular structures 51 respectively. The two protrusions 52 protrude toward the outer side of each one of the two semicircular structures 51 respectively. Each one of the two protrusions 52 comprises a fixing hole 521, and a packing assembly 53 is mounted through the fixing hole 521.

The packing assembly 53 comprises a screw 531 and a nut 532, and the screw 531 is corresponding to the nut 532. When the two semicircular structures 51 are opposite each other, the fixing hole 521 with one of the two semicircular structures 51 is aligned to the fixing hole 521 with the other one of the two semicircular structures 51. The screw 531 can penetrate through the fixing holes 521, and the nut 532 is screwed into the screw 531. The screw 531 and the nut 532 are mounted on two opposite sides of the fixing hole 521. The pressing force applied on the elastomer ring 30 by the partial filling jig 50A can be adjusted through controlling the screwed states between the screw 531 and the nut 532. The outer surface of the elastomer ring 30 can be pressed by the partial filling jig 50A evenly.

The full filling jig 70 comprises a body with a rolling surface around the body. The rolling surface is in an arc shape.

Figure 9:
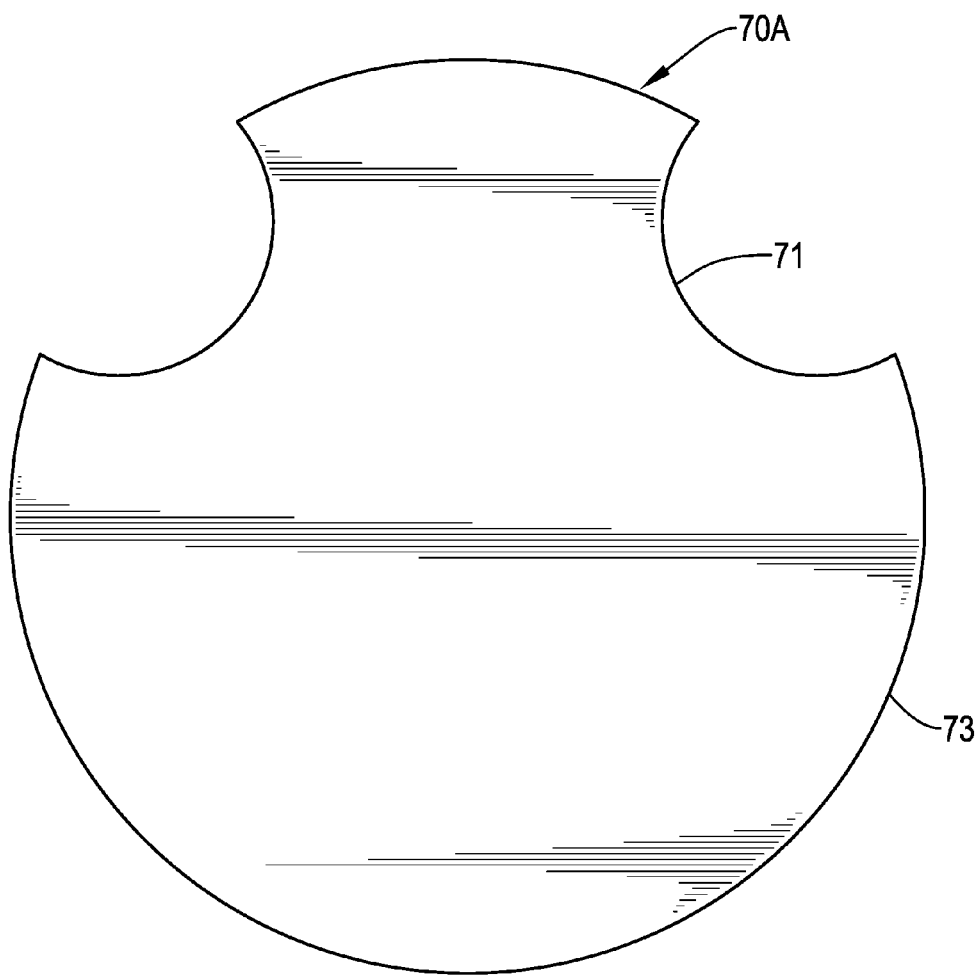
FIG. 9 is a schematic view of a preferred embodiment of a full filling jig in accordance with the present invention.

With reference to FIG. 9, another embodiment of the full filling jig 70A further comprises two cavities 71. The two cavities 71 are recessed on the rolling surface, and multiple limited rolling surfaces 73 are formed from dividing the rolling surface by the two cavities 71. Each one of the sub-rolling surfaces is arc-shaped. The full filling jig 70A can prevent the staff rolling around the elastomer ring 30 only at the step of pressing and rolling the elastomer ring 30 continuously. If the staff skips the pressing work at the step of full filling and does not press and roll the elastomer ring 30 according to the particular sequence, the elastomer ring 30 will not be disposed in the groove 221 evenly and the groove 221 may not be filled completely. The operation of the semiconductor processing equipment will be interfered by the elastomer ring 30. The product qualities may also be affected by the elastomer ring 30. Therefore, the problems caused by indolence of the staff can be resolved through using the full filling jig 70A.

Figure 10:
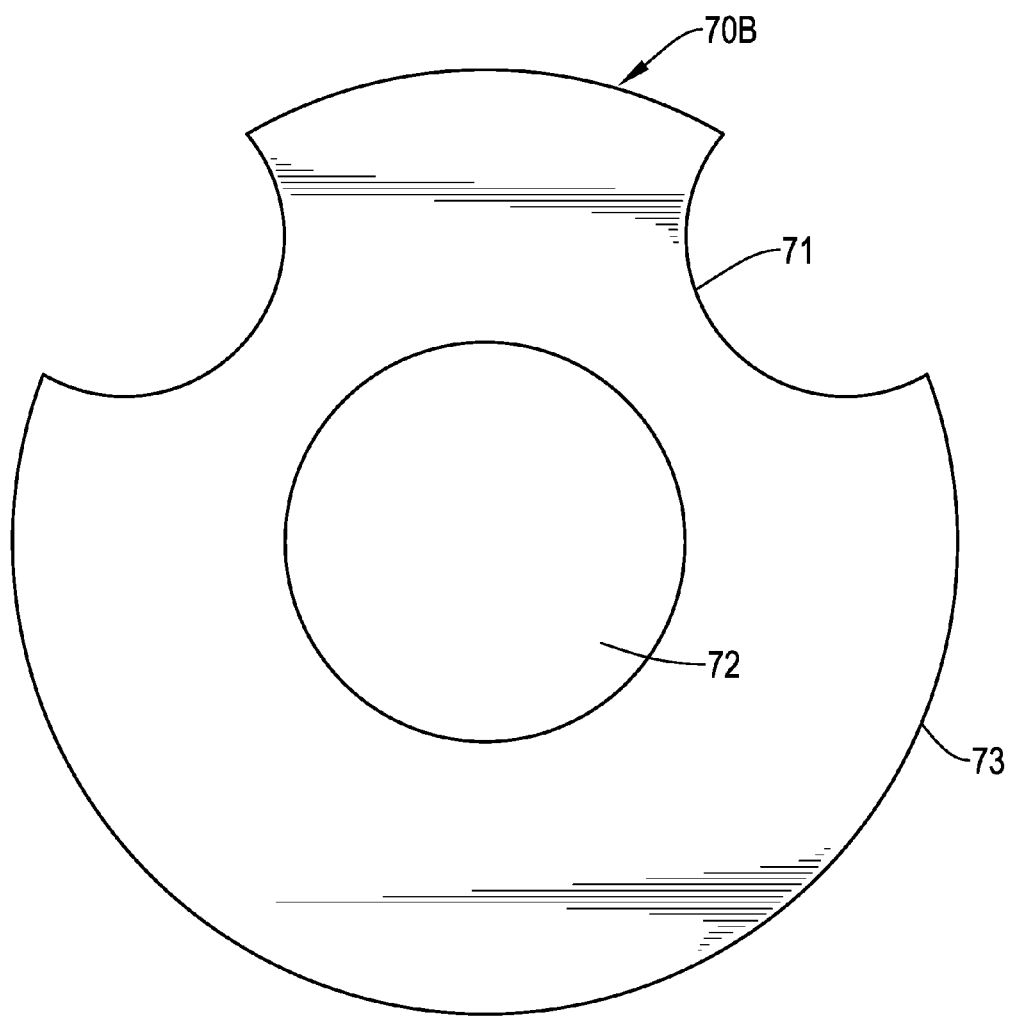
FIG. 10 is a schematic view of another preferred embodiment of the full filling jig in accordance with the present invention.

With reference to FIG. 10, another embodiment of the full filling jig 70B further comprises a through hole 72. The through hole 72 is formed at a geometric center of the body of the full filling jig 70B. This design not only reduces the weight of the full filling jig 70B but also provides convenience to user. Users may operate the full filling jig 70B stably by inserting the finger into the through hole 72. This design also prevents the full filling jig 70B from slipping off during the process.

Figure 11:
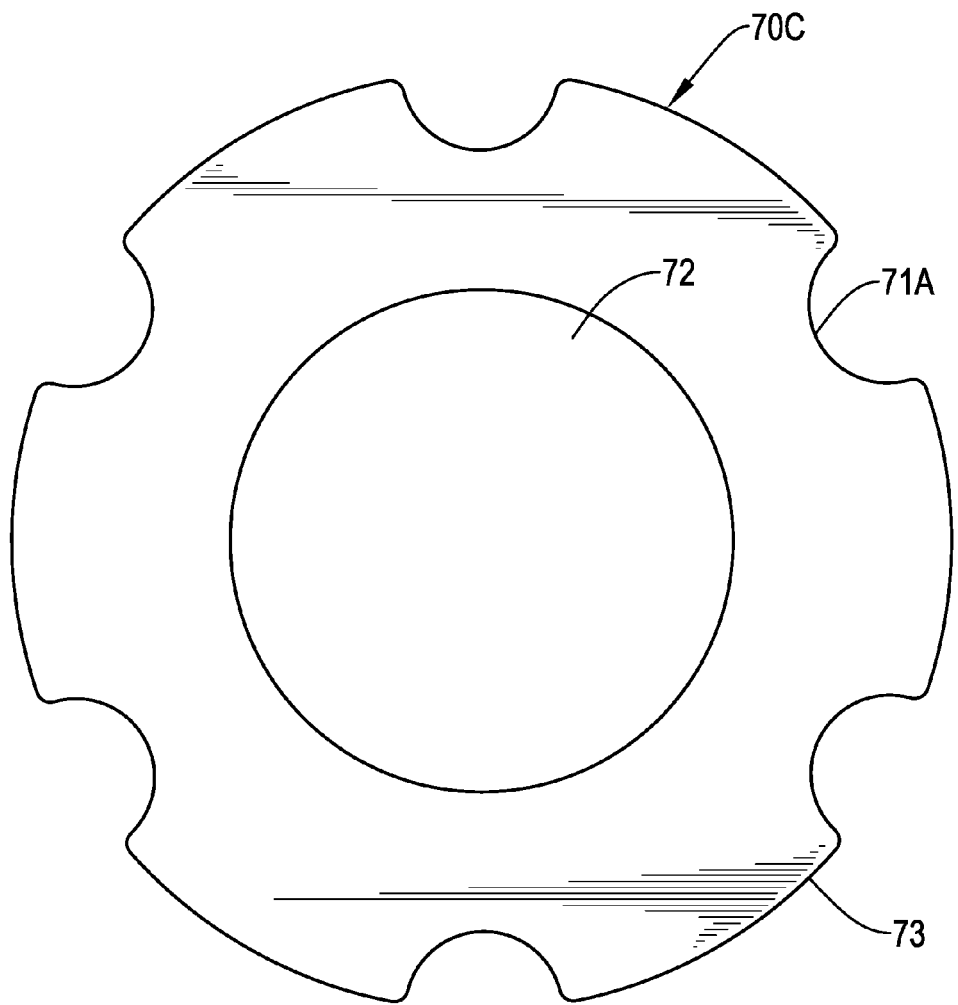
FIG. 11 is a schematic view of another preferred embodiment of the full filling jig in accordance with the present invention.

With reference to FIG. 11, another embodiment of the full filling jig 70C comprises: six cavities 71A and a through hole 72. The six cavities 71A are recessed on the rolling surface, and the through hole 72 is formed at a geometric center of the body of the full filling jig 70C. The rolling surface is divided into six segments by the six cavities 71A. The staff may be more forceful to press and roll the elastomer ring 30 in the particular sequence by this design. Using the full filling jig 70C ensures the elastomer ring 30 is disposed in the groove 221 evenly and completely.

Figure 12:
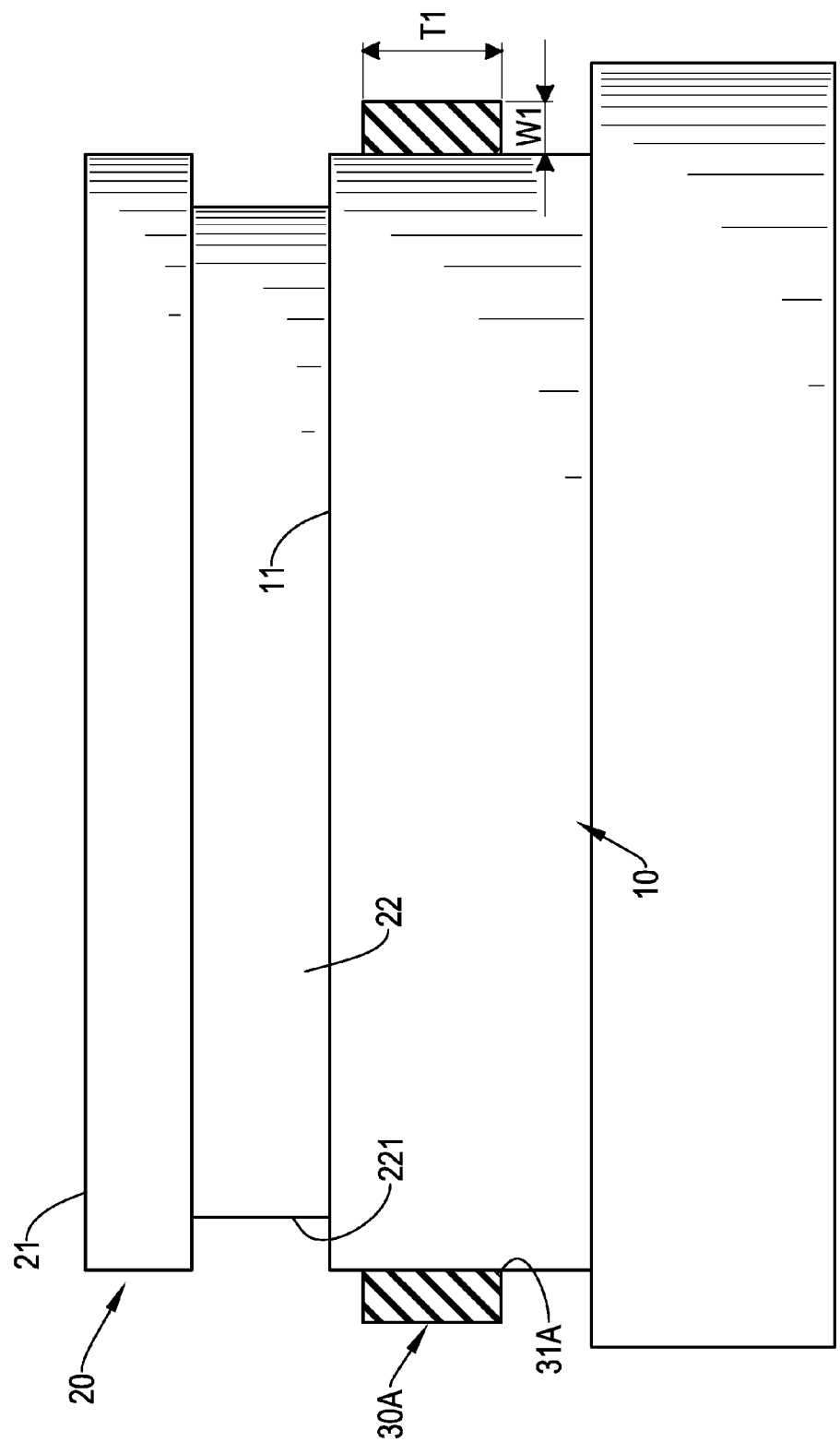
FIG. 12 is a schematic view showing another elastomer ring in accordance with the present invention is disposed on the side surface of the susceptor body.

With reference to FIG. 12, another method of installing an elastomer ring 30A in a semiconductor processing equipment in accordance with the present invention includes three steps. The first step is also preliminarily disposing the elastomer ring 30A. The elastomer ring 30A is mounted to the side surface of the susceptor body 10 and is close to the top surface 11. The elastomer ring 30A is stretched through disposing around and on the side surface of the susceptor body 10. The cross-section of the elastomer ring 30A is a rectangle, and the elastomer ring 30A includes a radial width W1 and a height T1. The ratio of the radial width W1 to the height T1 is less than 0.5. It means the height T1 is larger than double of the radial width W1.

Furthermore, a side toward the groove 221 of the elastomer ring 30A has two edges. The two edges are chamfered edges 31A respectively. The chamfered edges 31A help the elastomer ring 30A to be disposed in the groove 221 more easily.

Figure 13:
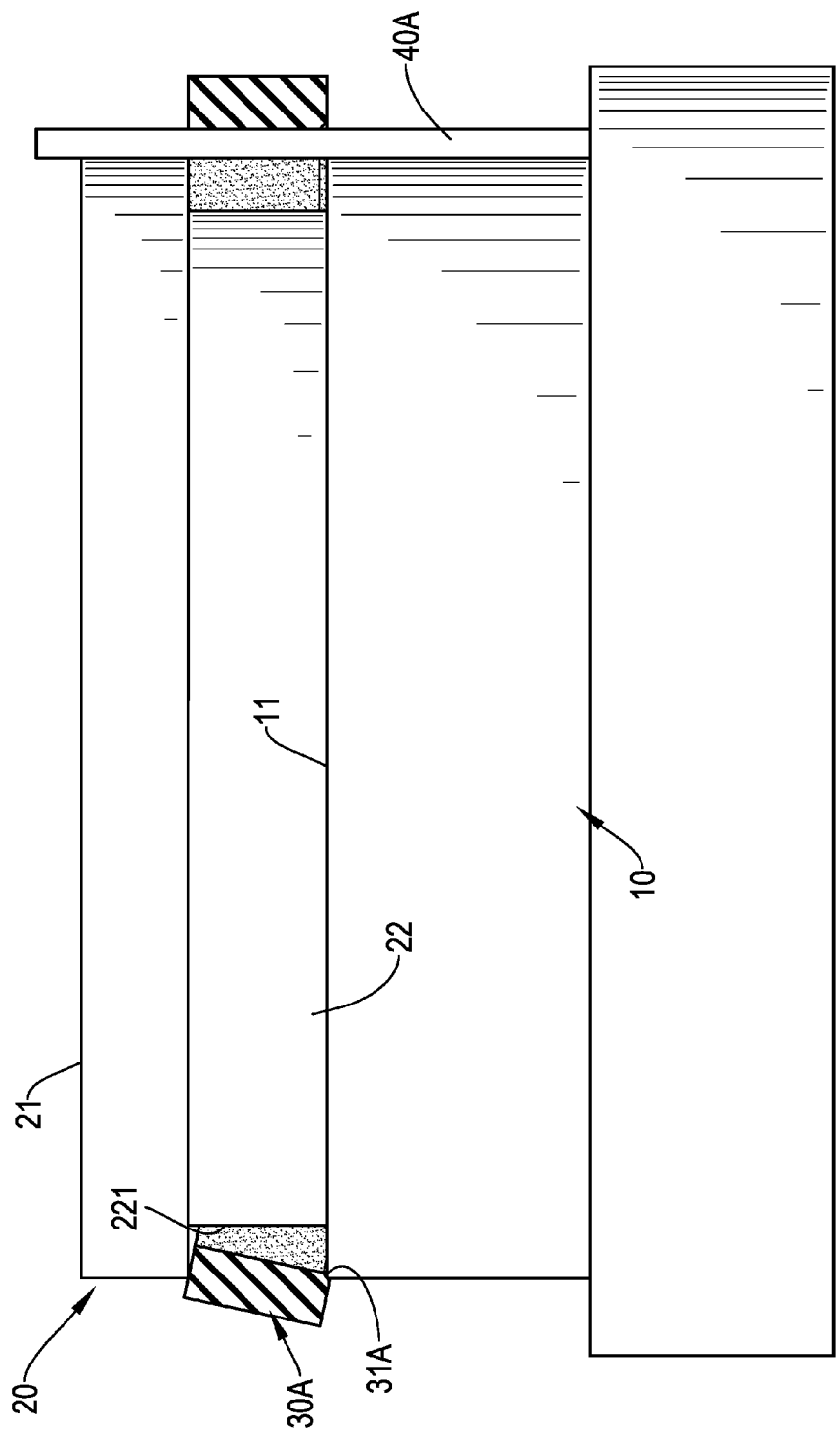
FIG. 13 is a schematic view showing the elastomer ring of FIG. 12 is disposed in the groove partially by a sheet.
Figure 14:
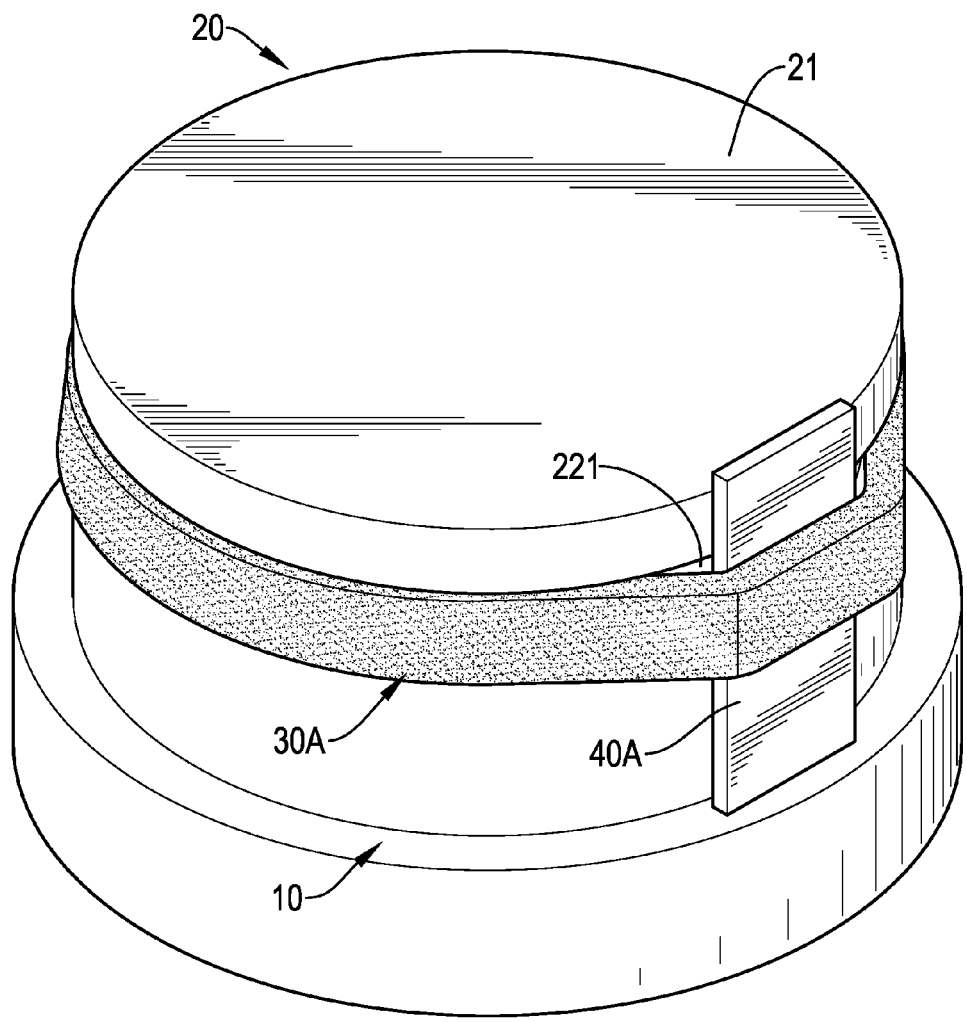
FIG. 14 is a perspective view showing the elastomer ring of FIG. 12 is disposed in the groove partially by a sheet.

With reference to FIGS. 13 and 14, the second step is covering the groove 221 and disposing the elastomer ring 30A partially. The elastomer ring 30A is moved to cover the groove 221 first. The sheet 40A is corresponding to the elastomer ring 30A in shape. The sheet 40A is inserted into a gap between the groove 221 and the elastomer ring 30A. The sheet 40A is pushed and moves around the groove 221. The sheet 40A helps to smoothen the elastomer ring 30A, and the elastomer ring 30A is disposed in the groove 221 evenly. The groove 221 is partially filled by the elastomer ring 30A. The right sides in FIGS. 13 and 14 show a state of the sheet 40A moving along the groove 221. The left sides in FIGS. 13 and 14 show a state of the elastomer ring 30A disposed into the groove 221 after smoothening. The sheet 40A is also made of the engineering plastic such as polytetrafluoroethylene (PTFE). The friction coefficient of the engineering plastic is less than conventional rubbers.

Figure 15:
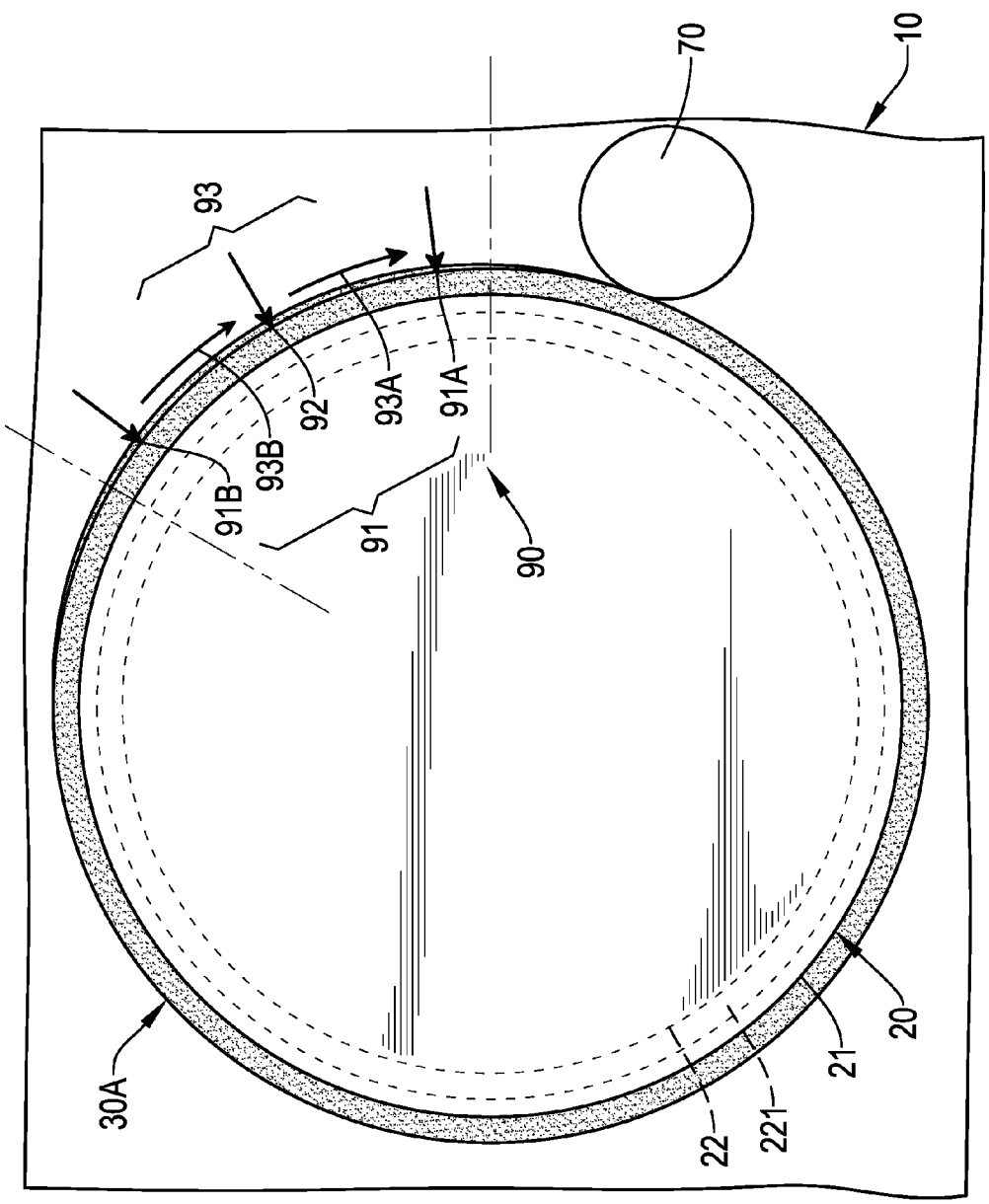
FIG. 15 is a top view showing the elastomer ring of FIG. 12 is pressed by the full filling jig.

With reference to FIG. 15, the third step is pressing the elastomer ring 30A completely. The elastomer ring 30A is pressed and rolled by a full filling jig 70. The full filling jig 70 contacts the outer surface of the elastomer ring 30A and makes the elastomer ring 30 move totally into the groove 221. The groove 221 is completely filled by the elastomer ring 30A after pushing and rolling by the full filling jig 70.

Figure 16:
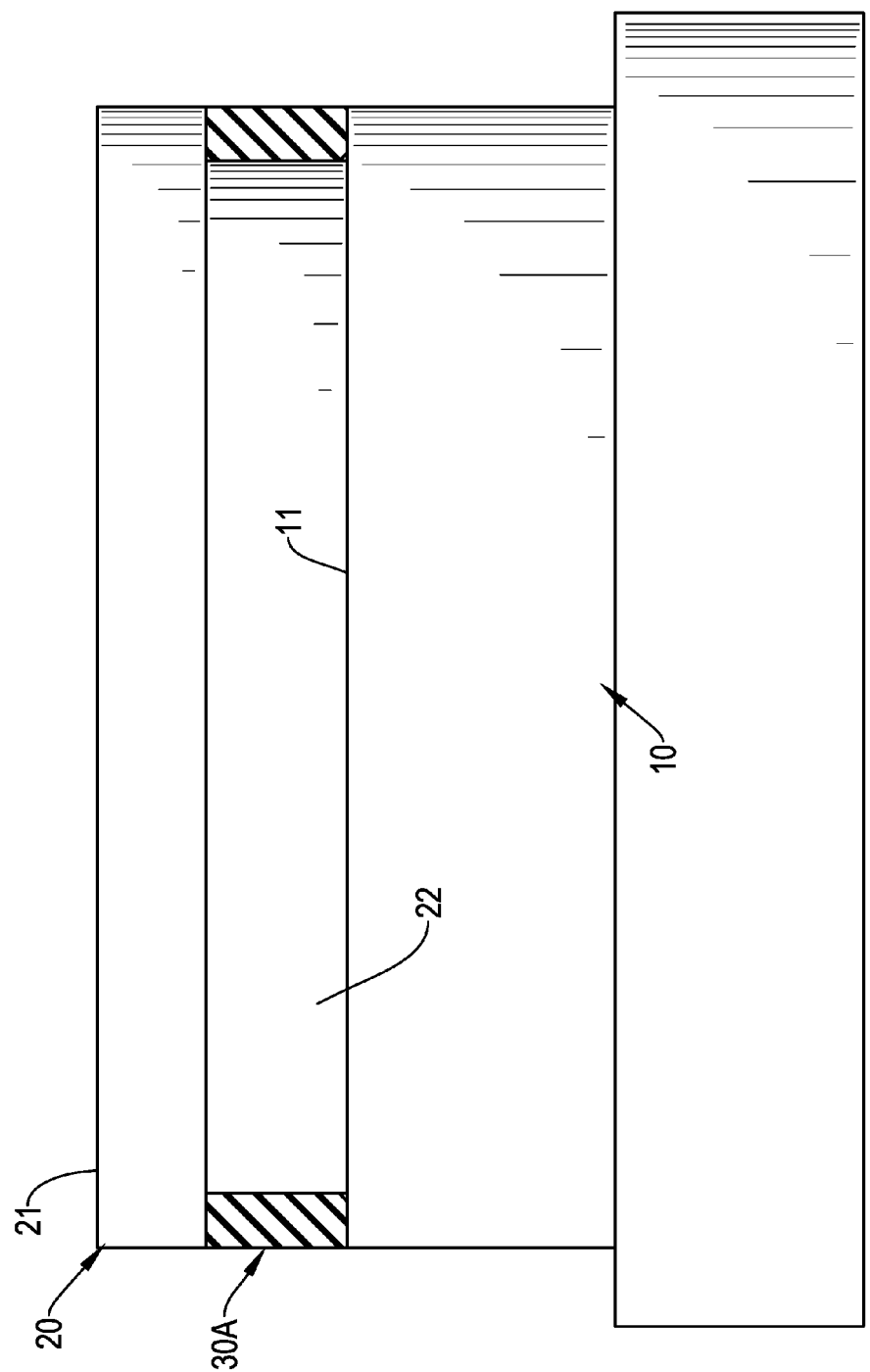
FIG. 16 is a schematic view of the elastomer ring of FIG. 12 pressed by the full filling jig in accordance with the present invention.

The outer surface of the elastomer ring 30A is pressed and rolled in a particular sequence by the full filling jig 70. Multiple arcs 90 of the outer surface of the elastomer ring 30A are defined by pre-marking the supporting element 20. Each one of the multiple arcs 90 has two terminal points 91, one intermediate point 92, and two rolling segments 93. The two terminal points 91 are a first terminal point 91A and a second terminal point 91B, and the two rolling segments 93 are a first rolling segment 93A and a second rolling segment 93B. The intermediate point 92 is in the middle between the first terminal point 91A and the second terminal point 91B. The first rolling segment 93A is between the first terminal point 91A and the intermediate point 92, and the second rolling segment 93B is between the second terminal point 91B and the intermediate point 92. The particular sequence comprises: the full filling jig 70 presses the first terminal point 91A before pressing the intermediate point 92, and then the full filling jig 70 rolls the first rolling segment 93A from the intermediate point 92 to the first terminal point 91A. Then the full filling jig 70 rolls the second rolling segment 93B from the second terminal point 91B to the intermediate point 92 after pressing the second terminal point 91B. The step of filling the elastomer ring 30A fully is finished when the multiple arcs 90 of the elastomer ring 30A are all pressed and rolled by the full filling jig 70 in the particular sequence. With reference to FIG. 16, the elastomer ring 30A is totally disposed in the groove 221 after the step of filling fully.

Figure 17:
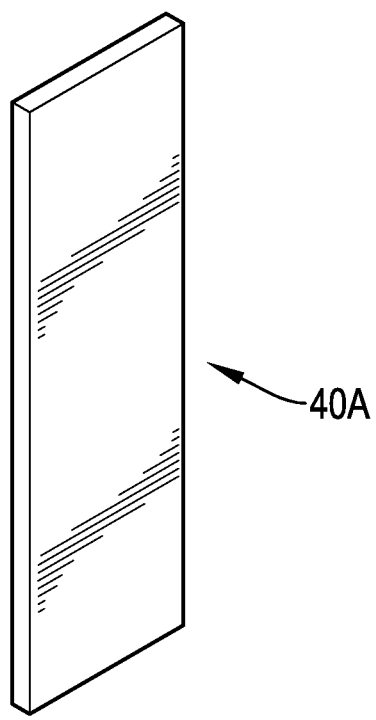
FIG. 17 is a schematic view of the sheet in accordance with the present invention.
Figure 18:
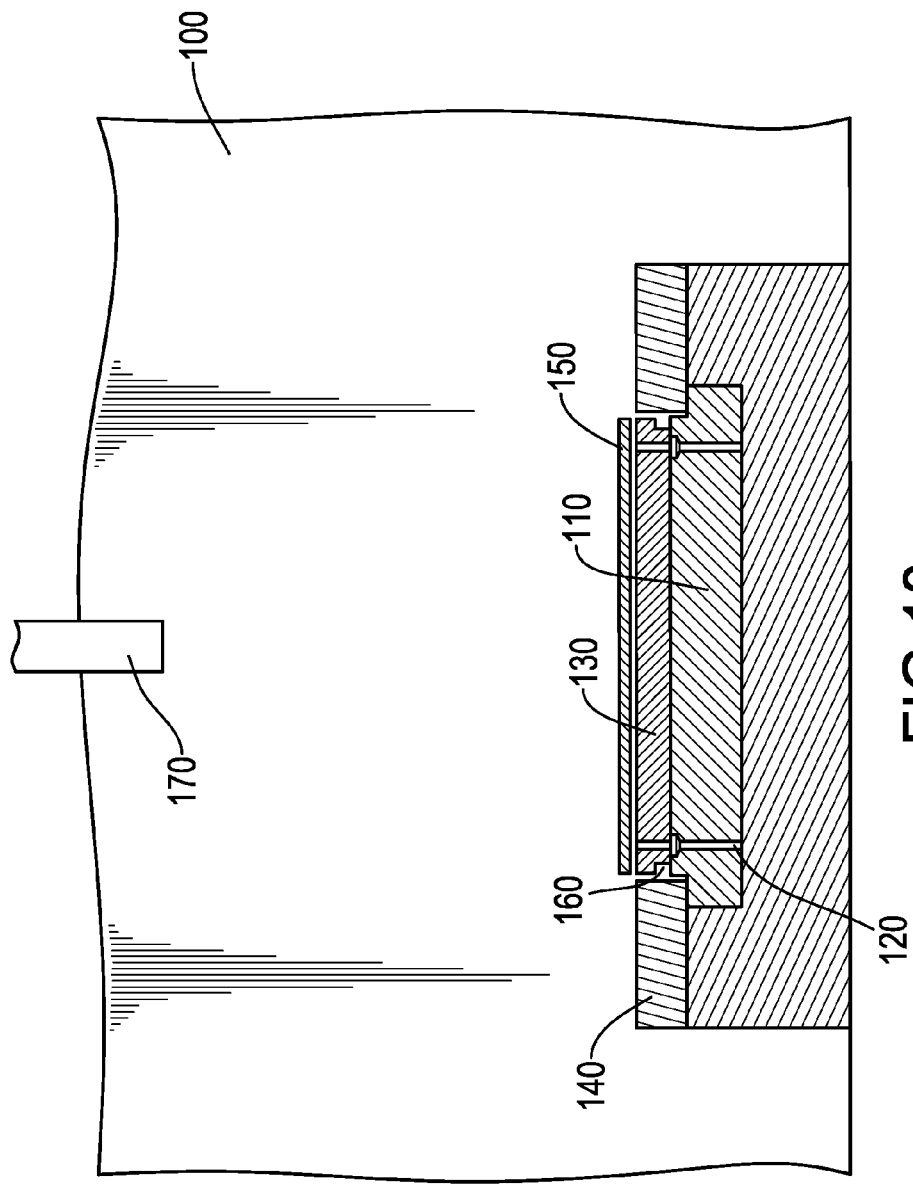
FIG. 18 is a schematic view of the conventional semiconductor processing equipment.
Figure 19:
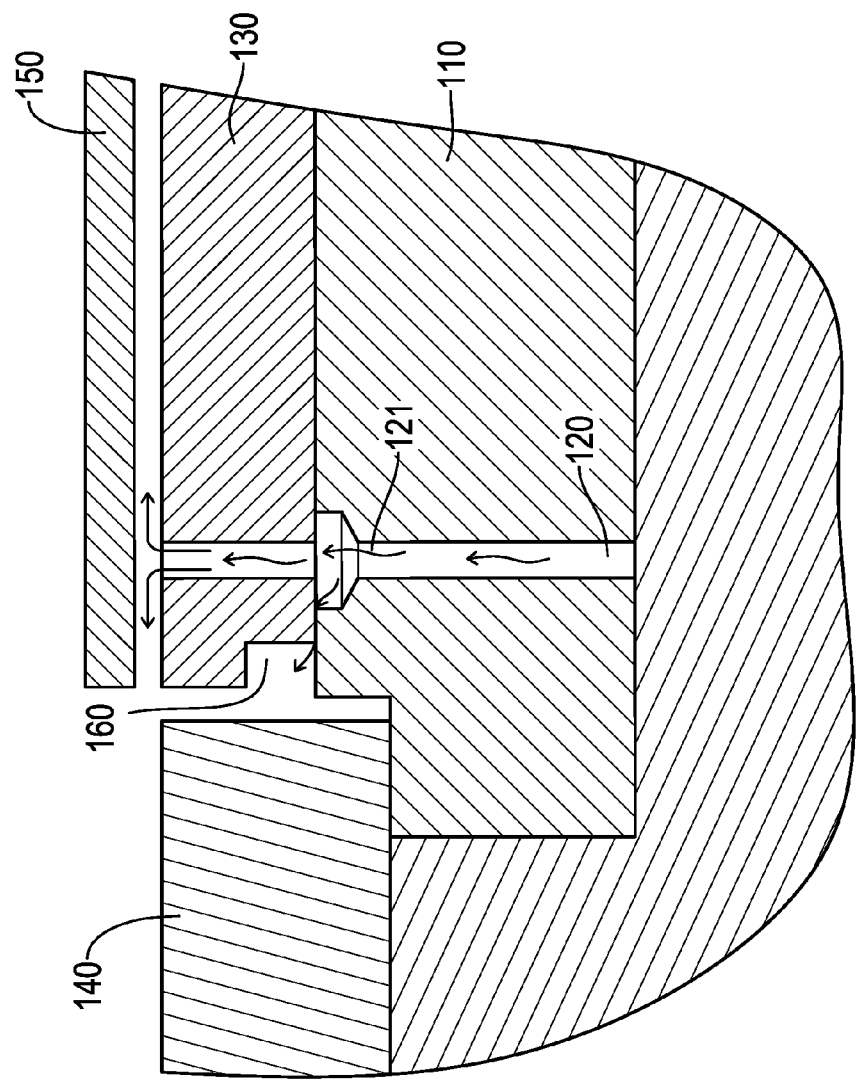
FIG. 19 is a partial enlarged view of FIG. 18.

With reference to FIGS. 13 and 17, the sheet 40A is a rectangular board. The sheet 40A comprises two opposite surfaces, and one of the two opposite surfaces is corresponding to the inner side of the elastomer ring 30A. The sheet 40A helps the elastomer ring 30A to move into the groove 221 easily and evenly.

In summary, the methods of installing an elastomer ring 30, 30A in a semiconductor processing equipment utilize the guiding sheet 40 or the sheet 40A to guide the elastomer ring 30, 30A to align to the groove 221 and be disposed in the groove 221 partially. Then the methods further utilize the partial filling jig 50 or the full filling jig 70 to press and roll the elastomer ring 30, 30A in the particular sequence or the particular sequence respectively before the elastomer ring 30, 30A is disposed in the groove 221 totally and then the groove 221 is completely filled by the elastomer ring 30, 30A. The elastomer ring 30, 30A may prevent the gas leak of the semiconductor processing equipment from the gaps between the susceptor body 10 and the connecting portion 22. The elastomer ring 30, 30A may also prevent the penetration of the plasma toward the groove 221 from inducing the pollution of the environment.

In addition, users may estimate the lifetime of the elastomer ring 30, 30A exactly through installing the elastomer ring 30, 30A completely. Users may also replace the elastomer ring 30, 30A regularly. The present invention reduces the error of the installing elastomer ring 30, 30A, and the semiconductor processing equipment is not abruptly interrupted from working by protrusions of the elastomer ring 30, 30A. The present invention helps to maintain the qualities of wafers and development of the semiconductor fabrication plant.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A method of installing an elastomer ring in a semiconductor processing equipment comprising a susceptor body including a top surface and a supporting element mounted to the top surface, and the supporting element comprising a top portion and a connecting portion, and a groove formed among the top surface, the top portion, and the connecting portion, and the method comprising steps of:
   disposing preliminarily: disposing the elastomer ring to a side surface of the susceptor body and close to the top surface;
   positioning: placing the elastomer ring into a notch formed on a guiding sheet; moving the elastomer ring toward a periphery of the groove with the guiding sheet, and then aligning the elastomer ring to the groove;
   filling partially: pressing the elastomer ring by a partial filling jig; disposing the elastomer ring into the groove and filling the groove partially by the elastomer ring; and
   filling fully: pressing the elastomer ring by a full filling jig until the groove is completely filled by the elastomer ring.

2. The method as claimed in claim 1, wherein multiple points on the elastomer ring are pressed in a particular sequence by the partial filling jig along an outer surface of the elastomer ring.

3. The method as claimed in claim 2, further comprising defining the outer surface of the elastomer ring equally into multiple arcs; pressing each one of the multiple arcs by the partial filling jig gradually; each one of the multiple arcs including two endpoints, one midpoint, and two relay points respectively; wherein the two endpoints are a first endpoint and a second endpoint, and the two relay points are a first relay point and a second relay point; the midpoint is in the middle between the first endpoint and the second endpoint; the first relay point is in the middle between the second endpoint and the midpoint, and the second relay point is in the middle between the first endpoint and the midpoint; the particular sequence is that the partial filling jig presses the first endpoint before pressing the second endpoint, and then the partial filling jig presses the midpoint; finally, the partial filling jig presses the second relay point after pressing the first relay point; the step of filling partially is finished when the multiple arcs are all pressed in the particular sequence.

4. The method as claimed in claim 3, wherein a cross-section of the elastomer ring is a rectangle; the elastomer ring comprises a radial width and a height, and the ratio of the radial width to the height is larger than 0.5.

5. The method as claimed in claim 4, wherein a side of the elastomer ring toward the groove comprises two edges; the two edges are chamfered edges.

6. The method as claimed in claim 2, wherein a cross-section of the elastomer ring is a rectangle; the elastomer ring comprises a radial width and a height, and the ratio of the radial width to the height is larger than 0.5.

7. The method as claimed in claim 6, wherein a side of the elastomer ring toward the groove comprises two edges; the two edges are chamfered edges.

8. The method as claimed in claim 1, wherein multiple points on the elastomer ring and multiple segments of the elastomer ring are pressed and rolled in a particular sequence by the full filling jig along an outer surface of the elastomer ring.

9. The method as claimed in claim 8, further comprising defining the outer surface of the elastomer ring equally into multiple arcs; pressing each one of the multiple arcs by the full filling jig gradually; each one of the multiple arcs including two terminal points, one intermediate point, and two rolling segments respectively; wherein the two terminal points are a first terminal point and a second terminal point, and the two rolling segments are a first rolling segment and a second rolling segment; the intermediate point is in the middle between the first terminal point and the second terminal point; the first rolling segment is between the first terminal point and the intermediate point, and the second rolling segment is between the second terminal point and the intermediate point; the particular sequence is that the full filling jig presses the first terminal point before pressing the intermediate point, and then the full filling jig rolls the first rolling segment from the intermediate point to the first terminal point; finally, the full filling jig rolls the second rolling segment from the second terminal point to the intermediate point after pressing the second terminal point; the step of filling fully is finished when the multiple arcs are all pressed and rolled in the particular sequence.

10. The method as claimed in claim 1, wherein a cross-section of the elastomer ring is a rectangle; the elastomer ring comprises a radial width and a height, and the ratio of the radial width to the height is larger than 0.5.

11. The method as claimed in claim 10, wherein a side of the elastomer ring toward the groove comprises two edges; the two edges are chamfered edges.

12. A guiding sheet for installing an elastomer ring in a semiconductor processing equipment as claimed in claim 1 comprising:
   a body portion; and
   a bending portion connected to the body portion;
   wherein an angle is formed between the body portion and the bending portion; a notch is recessed on a side of the bending portion opposite to the body portion, and the notch is corresponding to the elastomer ring in shape.

13. A partial filling jig for installing an elastomer ring in a semiconductor processing equipment as claimed in claim 1 comprising:
two semicircular structures; and
two packing assemblies mounted on the two semicircular structures respectively;
wherein each one of the two semicircular structures comprises two ends, and two protrusions are formed on the two ends of the each one of the two semicircular structures respectively; the two protrusions protrude toward an outer side of each one of the two semicircular structures respectively; inner sides of the two semicircular structures are opposite each other, and the inner sides of the two semicircular structures are corresponding to the elastomer ring in shape; the two packing assemblies are mounted on the two protrusions of each one of the two semicircular structures.

14. The partial filling jig as claimed in claim 13, wherein each one of the two protrusions comprises a fixing hole respectively; each one of the two packing assemblies comprises a screw and a nut, and the screw is corresponding to the nut; the screw and the nut are mounted on two opposite sides of each one of the two protrusions; the screw penetrates through the fixing holes of the two semicircular structures, and the nut is screwed into the screw.

15. A full filling jig for installing an elastomer ring in a semiconductor processing equipment as claimed in claim 1 comprising:
a body; wherein the body comprises a rolling surface, and the rolling surface is in an arc shape.

16. The full filling jig as claimed in claim 15, wherein the body comprises at least two cavities; the at least two cavities are recessed on the rolling surface; and multiple limited rolling surfaces are formed from dividing the rolling surface by the at least two cavities.

17. The full filling jig as claimed in claim 15, wherein a through hole is formed at a geometric center of the body.

18. A method of installing an elastomer ring in a semiconductor processing equipment, and the semiconductor processing equipment comprising a susceptor body including a top surface, a supporting element mounted to the top surface and including a top portion and a connecting portion, and a groove formed among the top surface, the top portion, and the connecting portion, the method comprising steps of:

disposing preliminarily: disposing the elastomer ring to a side surface of the susceptor body and close to the top surface;
covering and filling partially: covering the groove with the elastomer ring, and inserting a sheet into a gap between the groove and the elastomer ring to dispose the elastomer ring into the groove evenly; filling the groove partially by the elastomer ring; and
filling fully: pressing the elastomer ring by a full filling jig until the groove is completely filled by the elastomer ring.

19. The method as claimed in claim 18, wherein multiple points on the elastomer ring and multiple segments of the elastomer ring are pressed and rolled in a particular sequence by the full filling jig along an outer surface of the elastomer ring.

20. The method as claimed in claim 19, further comprising defining the outer surface of the elastomer ring equally into multiple arcs; pressing each one of the multiple arcs gradually by the full filling jig; wherein each one of the multiple arcs includes two terminal points, one intermediate point, and two rolling segments respectively; the two terminal points are a first terminal point and a second terminal point, and the two rolling segments are a first rolling segment and a second rolling segment; the intermediate point is in the middle between the first terminal point and the second terminal point; the first rolling segment is between the first terminal point and the intermediate point, and the second rolling segment is between the second terminal point and the intermediate point; the particular sequence is that the full filling jig presses the first terminal point before pressing the intermediate point, and then the full filling jig rolls the first rolling segment from the intermediate point to the first terminal point; finally, the full filling jig rolls the second rolling segment from the second terminal point to the intermediate point after pressing the second terminal point; the step of filling fully is finished when the multiple arcs are all pressed and rolled through the particular sequence.

21. The method as claimed in claim 18, wherein a cross-section of the elastomer ring is a rectangle; the elastomer ring comprises a radial width and a height, and the ratio of the radial width to the height is less than 0.5.

22. The method as claimed in claim 21, wherein a side of the elastomer ring toward the groove comprises two edges; the two edges are chamfered edges respectively.

* * * * *